United States Patent [19]
Gipstein et al.

[11] 3,985,915
[45] Oct. 12, 1976

[54] USE OF NITROCELLULOSE CONTAINING 10.5 TO 12% NITROGEN AS ELECTRON BEAM POSITIVE RESISTS

[75] Inventors: Edward Gipstein, Saratoga, Calif.; Wayne M. Moreau, Wappingers Falls, N.Y.; Omar U. Need, III, San Jose, Calif.

[73] Assignee: International Business Machines Corporation, Armonk, N.Y.

[22] Filed: Dec. 20, 1974

[21] Appl. No.: 534,542

[52] U.S. Cl. .................................. 427/43; 427/44; 96/35.1; 96/36.2
[51] Int. Cl.² ...................................... B05D 3/06
[58] Field of Search .............. 427/43; 96/35.1, 36.2, 96/115 P; 204/160.1

[56] References Cited
UNITED STATES PATENTS
3,535,137   10/1970   Haller et al. ........................... 427/43

OTHER PUBLICATIONS
Sherwood "Chem Abstracts" 63, 10110g 1965.
Osada et al. "Chem Abstracts" 64, 6881c 1966.

*Primary Examiner*—John H. Newsome
*Attorney, Agent, or Firm*—Joseph G. Walsh

[57] ABSTRACT

Very sensitive electron beam positive resists have been obtained using films of nitrocellulose containing 10.5 to 12% nitrogen.

2 Claims, No Drawings

USE OF NITROCELLULOSE CONTAINING 10.5 TO 12% NITROGEN AS ELECTRON BEAM POSITIVE RESISTS

FIELD OF THE INVENTION

The present invention is concerned with electron beam resists. More particularly, it is concerned with positive resists obtained by forming on substrates thin films of certain cellulose derivatives.

PRIOR ART

Positive acting polymeric electron beam resists are well known in the prior art. Such prior art is thoroughly discussed in, for example, U.S. Pat. No. 3,535,137 of Haller et al. That patent provides a very good discussion of typical methods for fabricating and using resist materials. As is explained in that patent, the process typically starts by dissolving a suitable polymer in a solvent. A thin polymer film is then formed on a substrate by a process such as, for example, spinning a drop of the dissolved polymer on the substrate surface and allowing it to dry. The polymer film may then be baked to improve the adhesion and handling characteristics of the film. The next step involves exposing selected portions of the polymer film to electron beam radiation, in the range of 5 to 30 kilovolts. This radiation causes scission of the bonds of the polymer. As a result of such scissions, the portions of the polymer film which have been exposed to the radiation may be selectively removed by application of a developer solvent while leaving the unexposed portion of the film still adhered to the substrate. When it is so desired, the remaining polymer film may be baked to eliminate undercutting. Following this, in cases where it is so desired, the exposed underlying substrate may be etched with a suitable etchant.

Prior art materials which have been particularly successful as positive acting electron beam resists include poly (methyl methacrylate) and certain poly (olefin sulfones). There are, however, relatively few materials which simultaneously possess all of the required properties to act as resists. It is necessary that the material be chemically resistant to etching solutions but still degrade under electron radiation. The material must be capable of adhering to the substrate as a film, and the film must resist cracking.

In the past, attempts have been made to use cellulose in the formation of electron beam resists. As far as we are aware, however, such attempts have always been unsuccessful.

SUMMARY OF THE INVENTION

According to the present invention, electron beam positive resists are formed using cellulose derivatives which have been rendered soluble by including in them a substituent group. Suitable solubilizing substituent groups include, for example, the nitro group, ester groups such as acetate or butyrate and ether groups such as methoxy groups.

If electron beam lithography is to compete with photolithography in throughput faster electron beam resists are required. We have now found that solubilized cellulose derivatives developed in appropriate solvents are high speed electron beam positive resists. Films of these materials were coated from organic solvents dried at 100° C and exposed to 25KV electron beams with decreasing doses to $1 \times 10^{-6}$ Coul/cm$_2$. A minimum solubility ratio of final thickness to initial thickness after development of 2.0 was used as a minimum criterion of resist sensitivity. The films exhibited good adhesion to silicon dioxide during etching of $0.5\mu$ lines. In comparison, U.S. Pat. No. 3,535,137 requires a minimum dose of $100 \times 10^{-6}$ Coul/cm$_2$ using poly methyl methacrylate as the resist material.

The results obtained according to the present invention, are shown in the following Examples:

|  | Cellulose Derivative | Developer | $\mu$coul/cm$^2$ Minimum Dose 25KV |
|---|---|---|---|
| Ex. 1 | Nitrocellulose, N 10.5 to 12% | Pinacolone (Di-t-butyl Ketone) | 1.5 |
| Ex. 2 | Cellulose Triacetate | 1.5-Dichloro-pentane | 2.5 |
| Ex. 3 | Cellulose Acetate Butyrate | 1.5-Dichloro-pentane | 2.5 |
| Ex. 4 | Cellulose Acetate Propionate | 1.5-Dichloro-pentane | 2.5 |
| Ex. 5 | Methyl Cellulose | Water (pH 1–6) | 2.0 |

The foregoing Examples were given solely for the purpose of illustrations of the preferred embodiments of the present invention and they are not to be construed as limitations on that invention, many variations of which are possible without departing from the spirit or scope thereof.

What is claimed is:

1. A process for forming an image with a positive resist, said process comprising the steps of:
   1. forming on a substrate a film comprising nitrocellulose containing from 10.5 to 12% nitrogen,
   2. exposing said film in a predetermined pattern to radiation with electron beams at a strength of from 5 to 30 KV,
   3. removing the radiation exposed portion of said film with a solvent.

2. A process as claimed in claim 1, wherein the solvent is di-t-butylketone.

\* \* \* \* \*